United States Patent [19]

Karam et al.

[11] Patent Number: 5,148,448
[45] Date of Patent: Sep. 15, 1992

[54] ADAPTIVE PREDISTORTION CIRCUIT WITH MEMORY

[75] Inventors: Georges Karam, Paris; Hikmet Sari, Creteil, both of France

[73] Assignee: U.S. Philips Corporation, New York, N.Y.

[21] Appl. No.: 494,088

[22] Filed: Mar. 14, 1990

[30] Foreign Application Priority Data

Mar. 14, 1989 [FR] France .................. 89 03306

[51] Int. Cl.$^5$ ........................... H04L 25/49
[52] U.S. Cl. ...................... 375/60; 455/126; 328/162; 332/107; 332/159; 332/103; 375/39
[58] Field of Search .............. 375/39, 67, 60; 455/126; 330/149; 328/162; 332/103, 107, 159, 160

[56] References Cited

U.S. PATENT DOCUMENTS

| | | | |
|---|---|---|---|
| 4,291,277 | 9/1981 | Davis et al. | 330/149 |
| 4,308,618 | 12/1981 | Levy et al. | 375/39 |
| 4,329,655 | 3/1982 | Nojima et al. | 330/149 |
| 4,633,484 | 12/1986 | Takeda et al. | 375/39 |
| 4,696,055 | 9/1987 | Marshall | 455/126 |
| 4,700,151 | 10/1987 | Nagata | 332/18 |
| 4,967,164 | 10/1990 | Sari | 330/149 |

FOREIGN PATENT DOCUMENTS 3221911 11/1983 Fed. Rep. of Germany .

OTHER PUBLICATIONS

A. A. M. Saleh et al., "Adaptive Linearization of Power Amplifiers in Digital Radio Systems", Bell System Technical Journal, Apr. 1983, vol. 62, No. 4, Part 1, pp. 1019-1033.

Primary Examiner—Benedict V. Safourek
Assistant Examiner—Young Tse
Attorney, Agent, or Firm—Bernard Franzblau

[57] ABSTRACT

An adaptive predistortion circuit with memory for a digital transmission system includes a set (10) of input registers storing various consecutive data symbols a predistortion circuit (11) for predistorting the data of the consecutive data symbols before they pass through a modulator (14) and then through an amplifier (15) and an adaptation circuit (19) which, in response to a demodulation (16, 17$_1$, 17$_2$, 18$_1$, 18$_2$) of the stream of transmitted data symbols continuously adapts the predistortion circuit (11) to the stream of input data symbols. The adaptation circuit (19) includes a set (21) of counters/accumulators which determine the center of gravity of the smeared spots (clouds) created by the distortion by calculating a set of errors that is used for adapting the predistortion circuit (11). Preferably, the predistortion circuit is a random access memory. In order to reduce the size of this random access memory the symmetry of the constellation is used and therefore at data input the constellation is reduced to a quarter of the constellation. Reverse operations are thus necessary at the output and in the adaptation loop.

19 Claims, 9 Drawing Sheets

ADAPTIVE PREDISTORTION CIRCUIT WITH MEMORY

BACKGROUND OF THE INVENTION

1. Field of the Invention

This invention relates to an adaptive predistortion circuit with memory for a digital transmission system transmitting input data suitable to levels of a signal constellation C, and occur at the rate of a symbol clock having a period T with the aid of a modulator and a power amplifier that distorts the signal by creating smeared spots (clouds) in the constellation, the circuit comprising:

a predistortion circuit for predistorting in the reverse sense the in-phase and quadrature input data symbols $a_n = (a'_n, a''_n)$ prior to their entering the amplifier in order to transmit expected levels, the predistortion circuit simultaneously taking into account L received input data symbols $a_{n+(L-1)/2} \ldots a_n \ldots a_{n-(L-1)/2}$ which are temporarily stored in a set of input shift registers, an adaptation circuit for continuously adapting the predistortion circuit to the stream of input data symbols in response to a demodulation of the stream of transmitted data symbols, by means of a comparing circuit that compares the in-phase and quadrature input data symbols $(a'_n, a''_n)$ with the in-phase and quadrature demodulated data symbols $(y'_n, y''_n)$ and by means of an interface circuit that realizes an adaptation algorithm.

The invention finds its applications in digital transmission systems such as data transmission modems, microwave radio relay links, and space communication systems.

2. Description of the Prior Art

For an efficient use of the available spectrum, the current digital transmission systems, specifically the microwave radio relay links and the systems for transmitting data over the telephone channels, use modulation methods having a large number of phase and amplitude states. However, these modulation methods are very sensitive to all types of distortion and, of course, to non-linear types of distortion caused by amplifiers, mixers and other non-linear circuits in the transmission chain. A particularly critical point with respect to the microwave radio relay links and satellite transmission is the non-linearity of the transmitting power amplifier or the on-board power amplifier in the case of satellite transmissions. These amplifiers are known for their non-linear characteristics. If they are used in their linear zone, the full extent of their power is not utilized. If they are made to operate near to their saturation power level, they will unacceptably distort the signal. In practice, for a given power amplifier, one fixes the level of the transmitted signal in order to establish a compromise between the signal-to-noise ratio and the non-linear distortion undergone by the signal. Thus, the optimum operating point of the amplifier is the one at which the joint effects of the additive noise of the channel and the non-linear distortion of the amplifier are minimized. For modulation methods with a large number of states (64-QAM and 256-QAM, for example) this point is remote from the saturation power level of the amplifier, which implies that the latter is not used efficiently. In order to enhance its efficiency, predistortion techniques (fixed or adaptive) are currently used which make it possible to reduce the effect of the power amplifier's non-linearity on the transmitted signal.

A currently used predistortion technique consists of inserting in the intermediate-frequency stage of the transmitter a non-linear circuit providing an approximation of the inverse function of the power amplifier whose non-linearities one seeks to compensate. If the exact inverse of the function of the amplifier could be synthesized, this technique would make it possible to have a perfect signal at the output (without any non-linear distortion). However, this cannot be realized because the exact inverse function would require a circuit of infinite complexity. In practice one is satisfied with making an approximation and in most cases the Taylor series representing the non-linear function of the amplifier is limited to the third order and a predistortion circuit is synthesized, also of the third order, in a manner such that the two cascaded circuits no longer have third-order distortion. Higher-order terms (fifth order and seventh order) appear at the output but have smaller amplitudes compared to the initial third-order distortion. The result is then a certain improvement of the performance of the system. A disadvantage of these predistortion circuits in the intermediate frequency stage resides in the fact that they are analog circuits. They are hard to make adaptive and require readjustment from time to time in order to compensate for the variations of the amplifier response according to time and temperature. This predistortion technique has to be dispensed with if one wishes to have an automatic transmit power control.

Another more recent predistortion technique consists of modifying the alphabet of the data to be transmitted. This technique, called "Data Predistortion", or "Baseband Predistortion" is known from U.S. Pat. No. 4,291,277 and from the article by A. A. M. SALEH and J. SALZ "Adaptive Linearization of Power Amplifiers in Digital Radio Systems", Bell System Technical Journal, Vol. 62, April 1983, pp. 1019-1033.

In the article by A. A. M. SALEH and J. SALZ, FIG. 1 presents a schematic representation of an adaptive predistortion circuit which supplies to the input of the modulator a distorted constellation on the basis of the original "square" constellation, for example, an amplitude modulation of two quadrature carriers (QAM). The amplifier acts on the constellation by producing a net compression and a net rotation of the points having large amplitudes. In order to compensate for this effect the original constellation is distorted so that it resumes its original square shape after passing through the power amplifier. Thus, when the distortion circuit is optimized, it forms the inverse of the power amplifier (apart from a constant gain and a constant phase shift) and allows for perfect compensation of the non-linearities of the amplifier. In order to make this circuit adaptive, the signal is recaptured at the output of the amplifier, demodulated, then sampled at the symbol transmission rate 1/T and these samples are compared to the points corresponding with the QAM constellation used. These comparisons make it possible to obtain a control signal which enables optimization of the predistortion circuit with the aid of a conventional algorithm. However, the scheme used in FIG. 1 is very simplistic because it does not have any filtering before the modulator or before the power amplifier. Thus, it does not correspond with the solution generally used. In effect, in the real systems a spectral shaping signal filtering of the Nyquist type is always used which makes it possible to limit the signal band while quaranteeing a zero intersymbol interference at the decision instants. This filtering is generally equally divided between the transmit and receive ends so as to maximize the signal-to-noise ratio at the decision instants. In such systems the effect of the non-linearity of the amplifier is two-fold: the constellation is not only deformed but intersymbol interference appears, associating a cloud of points to each point of the constellation. With the above-described predistortion technique it is, however, not possible to compensate for this second effect.

U.S. Pat. No. 4,291,277 also describes an adaptive predistortion technique. The objects aimed at are similar. In order to perform the correction the symbol $a_n$ received at a given instant is used. The Patent also indicates that it is possible to associate other symbols received at different instants by storing them in an input register. However, this approach is much more complex to implement by way of experiment and U.S. Pat. No. 4,291,277 is restricted to dealing with the case of a single symbol, without discussing this difficulty. In effect, when various symbols are taken into account received at instants (earlier and/or later) different from the instant at which the symbol $a_n$ is received, it is necessary to take account of a large number of data symbols for modifying the process which is to take place. In addition, in this circuit, the predistortion circuit is adapted stochastically, that is to say, that the error signal is directly used for correcting the predistorted symbols. This is insufficient if a filtering precedes the amplifier because the points of the received constellation are then clouds of points. Finally, it should be observed that the filtering appearing before the modulator in U.S. Pat. No. 4,291,277 is not a filtering performing a transmit signal shaping, but only a filtering intended to eliminate the high frequencies caused by the digital-to-analog conversion and does not make it possible to limit the transmit signal band to a value below 1/T.

SUMMARY OF THE INVENTION

It is an object of the invention to define a structure of an adaptive predistortion circuit that may take into account and employ various symbols received at different instants in order to reduce the distortion and to diminish at the output the size of the obtained cloud of points.

According to the invention this object is achieved by means of an adaptive predistortion circuit with a memory as described in the preamble, characterized in that the adaptation circuit comprises, inserted between the comparator circuit and the predistortion circuit, a set of counters/accumulators which determine the centre of gravity of each smeared spot (cloud) of the received constellation by calculating a set of mean errors that is used to adapt. The predistortion circuit, the adaptive predistortion circuit has a memory further including a first transmit filter $F_e$ located before the modulator operating on the in-phase and quadrature paths and a second filter $F_r$ located after the demodulator, also operating on the in-phase and quadrature paths and in a manner such that the product of the filtering performed by the first and second filters $F_e$ and $F_r$ corresponds with a Nyquist filtering.

A further object of the invention is to reduce as much as possible the number of components necessary for realizing such a circuit, particularly the size of the memories.

Therefore, a simplification consists of carrying out an operation on the basis of a quarter of the constellation and deducing therefrom the results for the whole constellation. This further object is achieved in that, in the adaptive predistortion circuit with a memory according to the invention, a circuit for transforming the constellation C into a quarter of the constellation C/4 is inserted between the set of input registers and the predistortion circuit, which C-to-C/4 transforming circuit transforms all the received symbols $\bar{a}_n$ belonging to the full constellation plane C into their images $a_n$ belonging to a given quarter constellation plane C/4 and performs a rotation by $k\pi/2$ of the symbols preceding and subsequent to the symbol $a_n$, where $k=0, 1, 2$ or 3 according to the original quarter plane of the constellation C. The predistortion circuit is followed by a C/4-to-C reverse transforming circuit restoring the order of constellation C, a C-to-C/4 transforming circuit also being connected between the adaptation circuit and the demodulator in the adaptation loop. Rotation circuits are necessary to rotate the subsequent and preceding data in the same direction as that imposed by the C-to-C/4 transformation performed on the data $a_n$.

A further simplification consists of taking only a reduced number of symbols. Preferably, the number of symbols taken into account is equal to 3:

$$a_{n-1}, a_n, a_{n+1}.$$

Another simplification consists of taking only a part K' (K'<K) from the bits constituting the preceding and subsequent digital data that have been taken into account and this with the aid of a K-to-K' encoder which makes a partition of the constellation.

Therefore, the C-to-C/4 transforming circuit comprises at the output of the rotation circuit a K-to-K' encoder encoding the K bits of each symbol into K' bits.

A partition which is easy to perform consists of making a selection of the K' most significant bits of each data symbol (regarded as a complex element).

The part K' may be formed by 4 bits, the bits taken into account being the 2 sign bits and the 2 most significant bits.

The part K' may be formed by 2 bits, the bits taken into account being the 2 sign bits.

BRIEF DESCRIPTION OF THE DRAWING

The invention will be better understood from the following description when read in conjunction with the accompanying drawing given by way of non-limiting example, and wherein.

DETAILED DESCRIPTION OF THE PREFERRED EMBODIMENTS

Figure 1:
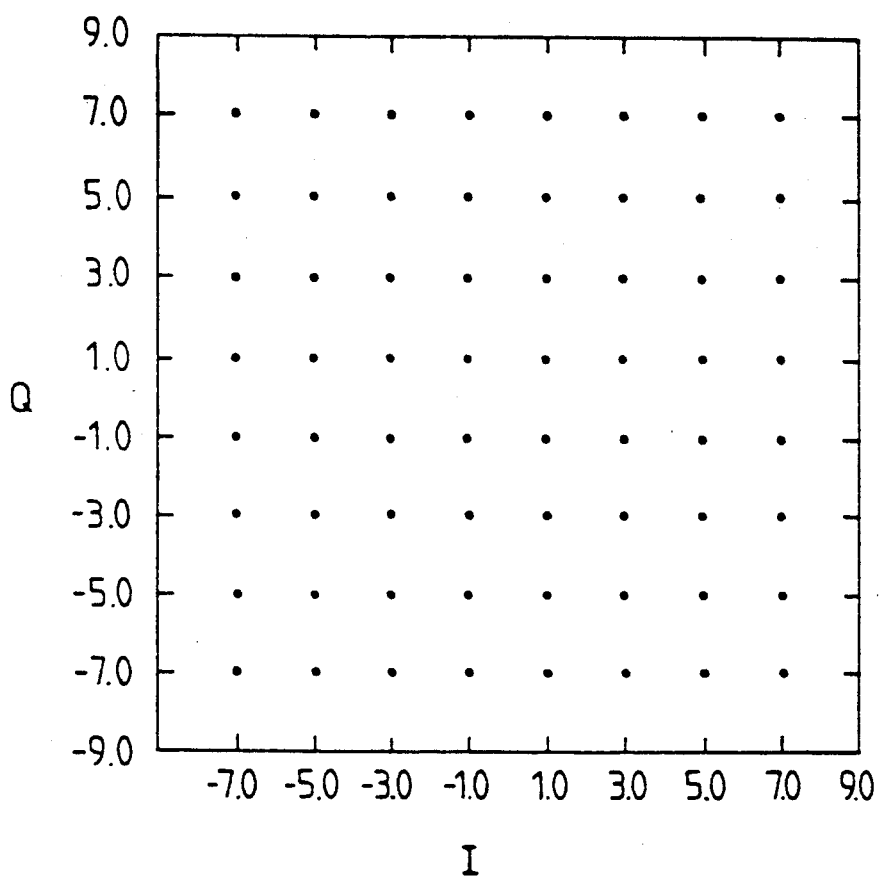
FIG. 1 shows the constellation of a 64-QAM modulation.

FIG. 1 illustrates the representation of the constellation of a signal of the 64-QAM type. The inputs I (in-phase) and Q (quadrature) of the modulator are independent and the symbols on each path take their values in an alphabet ($\pm d$, $\pm 3d$, $\pm 5d$, $\pm 7d$) where 2d is the minimum distance between two adjacent points of the constellation.

Figure 2B:
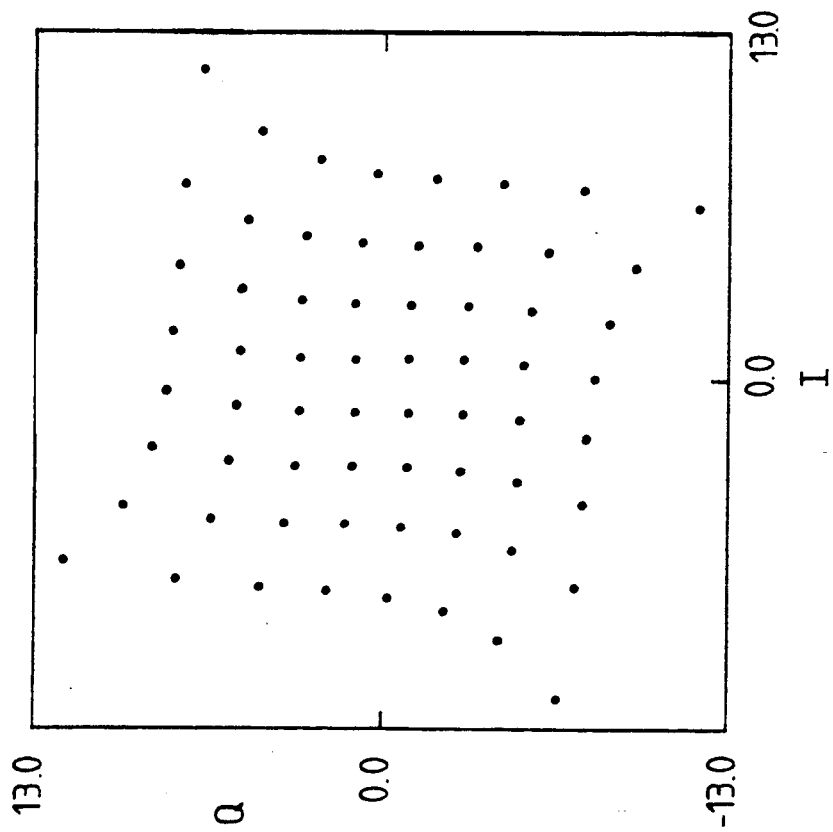
FIG. 2B shows a predistorted constellation optimized for compensation of the distortion shown in FIG. 2A according to the prior art techniques.
Figure 2A:
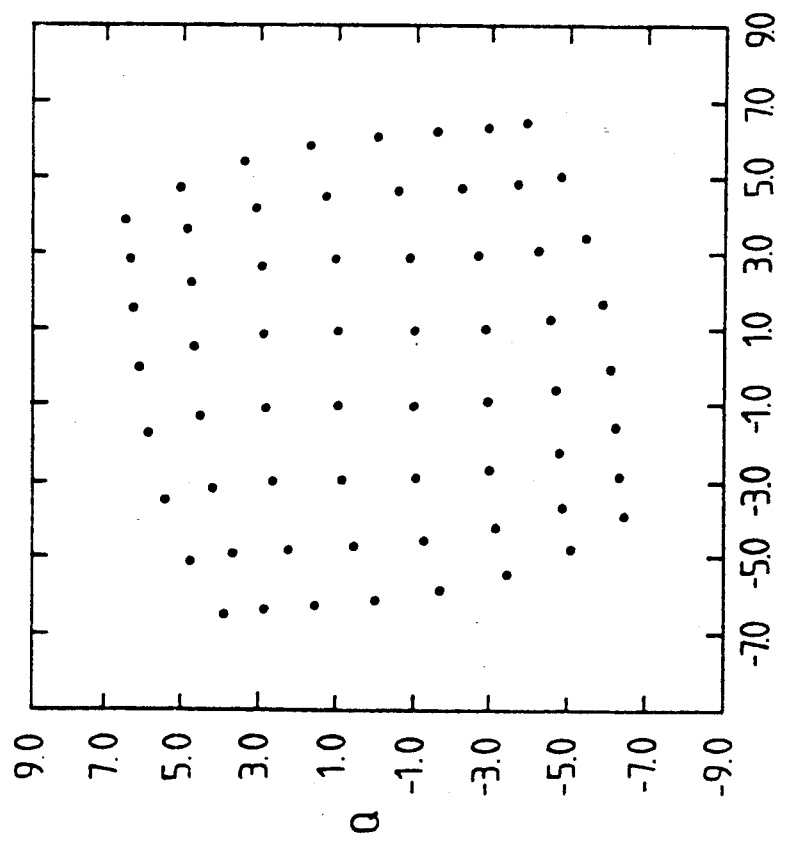
FIG. 2A shows a 64-QAM constellation distorted by the power amplifier in a system without a filtering or in the case where all filtering is effected after the amplifier stage.

In order to be transmitted, the signal from the modulator is fed to a power amplifier, which is generally used at reduced power, that is, in a linear part of its characteristic. At full power this amplifier is non-linear and distorts the signal in an unacceptable manner. If a constellation of the 64-QAM type is observed at the output of such an amplifier operating near to saturation, a distorted constellation like the one represented in FIG. 2A will be observed. According to the prior art it is then sufficient to predistort the constellation in the reverse sense according to the diagram of FIG. 2B, so that at the output of the amplifier the non-deformed constellation is obtained. However, so simple a situation is not in conformity with reality where filtering always takes place before the power amplifier specifically to limit the bandwidth of the signal. In the absence of filtering, the signal at the input of the modulator varies in steps once per symbol period T. Thus, a predistortion circuit acting on the signal at a rate of 1/T allows of a perfect compensation. In contradistinction thereto, when the signal is filtered, it no longer varies in steps but in a continuous way. For a perfect compensation for the effect of non-linearity it will no longer be sufficient to observe the signal once per symbol period T and to compensate for the distortion at these instants.

Figure 3B:
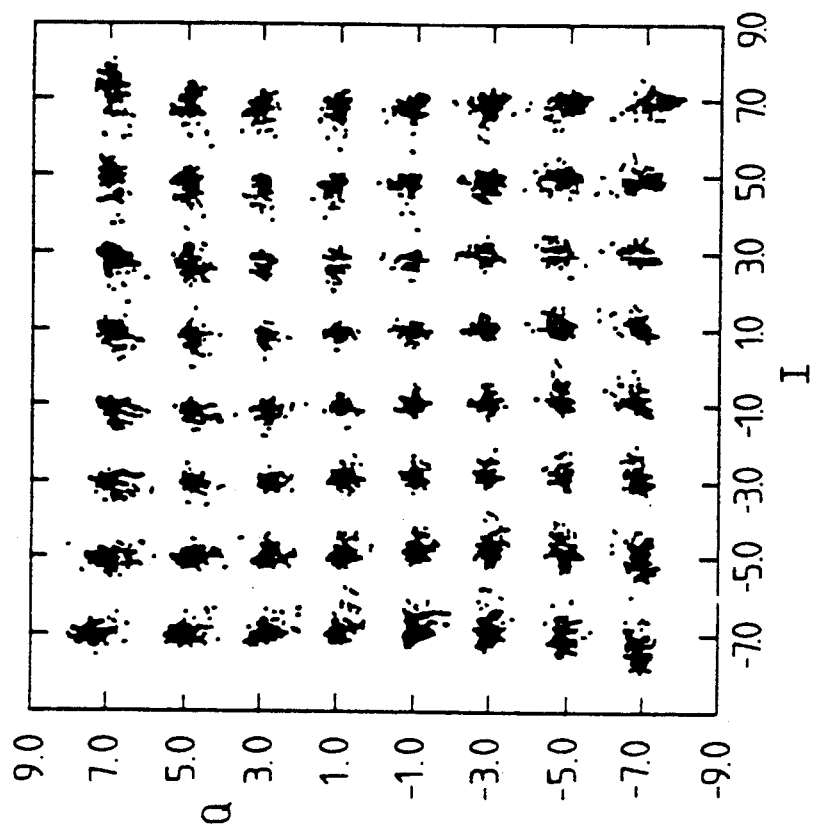
FIG. 3B shows the distorted constellation in the same situation as that of FIG. 3a, but including the prior art predistortion circuit.
Figure 3A:
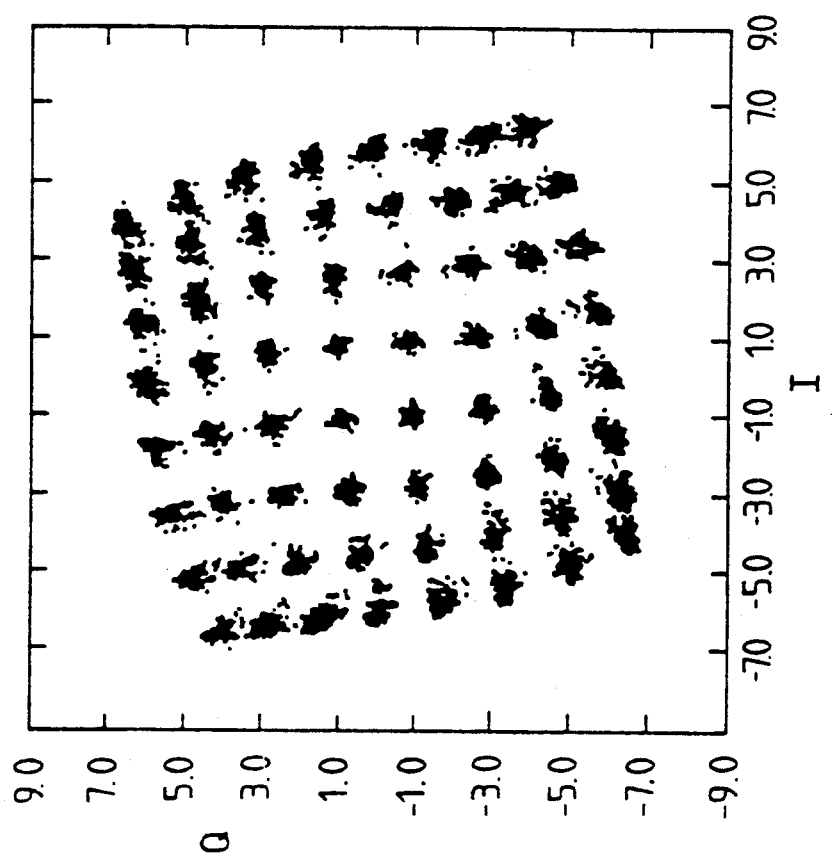
FIG. 3A shows the constellation distorted by the amplifier as it appears when the overall filtering is equally divided between the transmit and receive ends and the transmit end part is located before the amplifier.

With a filtered signal the constellation at the output of the amplifier is represented in FIG. 3A. It becomes the one represented in FIG. 3B with the prior-art predistortion circuit. Thus, each point of the constellation becomes a cloud of points, which is unacceptable. In order to operate with a filtered signal a more complex correction will thus have to be carried out.

The invention recognizes the fact that the signal $y_n$ received by the receiver does not solely depend on the symbol $a_n$ at the instant nT, but also on the future symbols $a_{n+1}$, $a_{n+2}$, ... and the past symbols $a_{n-1}$, $a_{n-2}$, . . . . This reflects the intersymbol interference which is expressed by the transformation of the points of the "cloud" constellation. A perfect data predistortion consists of sending predistorted symbols $d_n$ instead of original symbols $a_n$ so that at the receive end, the received signal $y_n$ is equal to $a_n$. Since $y_n$ is a function of ... $a_{n-1}$, $a_n$, $a_{n+1}$, ... the predistorted symbol $b_n$ also has to be a function of ($a_n$, $\sigma_n$) with $\sigma_n = (\ldots a_{n-2}, a_{n-1}, a_{n'}, a_{n+1}, a_{n+2}, \ldots)$. Therefore, the predistortion circuit has to be addressed by all of the symbols ($a_n$, $\sigma_n$) at a time in order to produce the predistorted symbol $b_n$ at its output. This technique is called predistortion with memory. In order to have a predistortion circuit that can be realized, it is addressed by a finite number of symbols. For example, with $L = 2M+1$ symbols, the predistortion circuit is thus addressed by ($a_n$, $\sigma'_n$) where $\sigma'_n = (a_{n-M}, a_{n-M+1}, \ldots, a_{n-1}, a_n, a_{n+1}, \ldots, a_{n+M})$.

Let us assume that D is the number of points of the constellation. Addressing the predistortion circuit by ($a_n$, $\sigma'_n$) narrows down to dividing each of the D clouds of the received constellation into $D^{2M}$ sub-clouds. Each of these sub-clouds corresponds with a particular realization of $\sigma'_n$. It is an object of the predistortion with a memory of length $L = 2M+1$ to calculate $b_n$ as a function of ($a_n$, $\sigma'_n$) so that the centres of gravity of the sub-clouds ($D \times D^{2M}$ centers) merge with the corresponding points of the original constellation. Thus, having made this predistortion, one obtains a received constellation so that the D resultant clouds have a smaller size than the one obtained if a predistortion without memory is effected, that is to say, if the predistortion circuit is addressed only by $a_n$.

Figure 4:
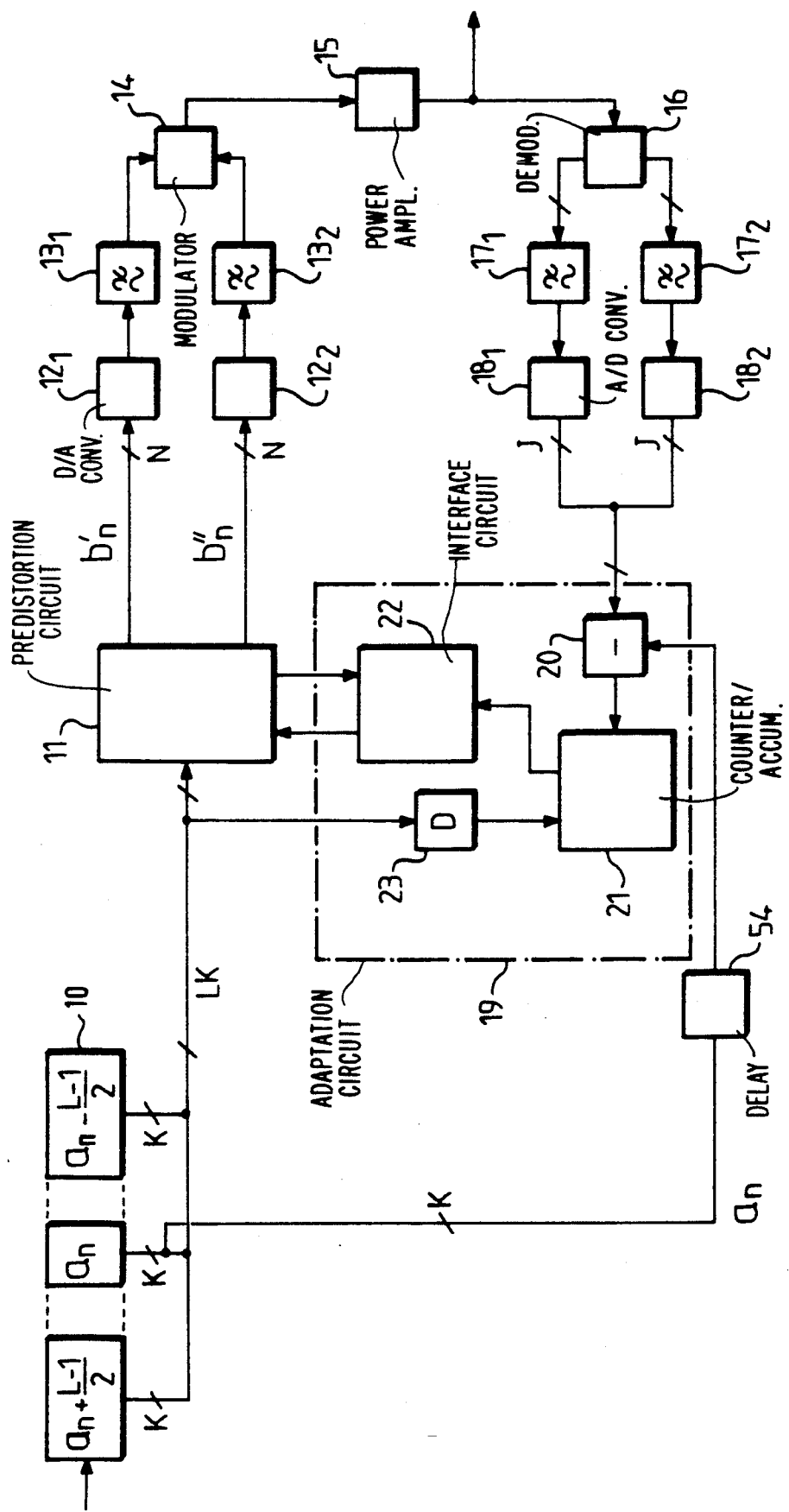
FIG. 4 is a diagram of an adaptive predistortion circuit having a memory according to the invention by means of which it is possible to process various symbols received at preceding and/or subsequent instants.

The diagram of FIG. 4 shows an adaptive predistortion circuit comprising a memory 10 formed by a set of ten input shift registers. At a given instant this set of registers stores L symbols $a_{n+(L-1)/2}$ . . $a_n$ . . $a_{n-(L-1)/2}$. All these symbols are encoded with K bits. The sum of the LK bits is used to address a predistortion circuit 11 which is preferably constituted by a Random Access Memory (RAM). The circuit 11 supplies the predistorted digital data in-phase $b'_n$ and quadrature $b''_n$ encoded with N bits. These digital data are converted into analog data by the respective digital-to-analog converters $12_1$ and $12_2$ followed by the respective transmit filters $13_1$ and $13_2$. These two data streams are used to modulate a carrier in the modulator 14 which is followed by the non-linear amplifier 15 itself connected to the transmit units. An adaptation loop receives the output signal of the amplifier 15. This loop comprises a demodulator 16 which supplies respective in-phase and quadrature signals to two filters $17_1$, $17_2$ connected respectively to two analog-to-digital converters $18_1$, $18_2$ which are connected to an adaptation circuit 19. The in-phase and quadrature signals which have thus been filtered and encoded with J bits ($y'_n$, $y''_n$), are fed to a comparator circuit 20 which receives the K bits of the symbol $a_n$ to supply an error signal. This error signal enters a set of counters/accumulators 21 which stores this value in order to determine, after an averaging interval, the centers of gravity of the sub-clouds of the constellation. The comparison between the values of the gravity centers and points of the nominal constellation yields a total number of errors which is used by an interface circuit 22 which employs an adaptation algorithm in order to adapt the stored data in the predistortion circuit 11. Two delay elements 23 and 54 are used to synchronize the data.

The transmit filters $13_1$, $13_2$ have to be cascaded with the one arranged at the receive end (not shown) in order to provide an overall filtering verifying the Nyquist criterion, that is to say, eliminating the intersymbol interference at the decision instant in the absence of the non-linear amplifier. Consequently, the signal at the output of the auxiliary demodulator 16 is to undergo a filtering $17_1$, $17_2$ which is identical with the one located at the receive end before the signal is compared to the desired signal so as to evaluate the error signal which is used for the adaptation.

Figure 6:
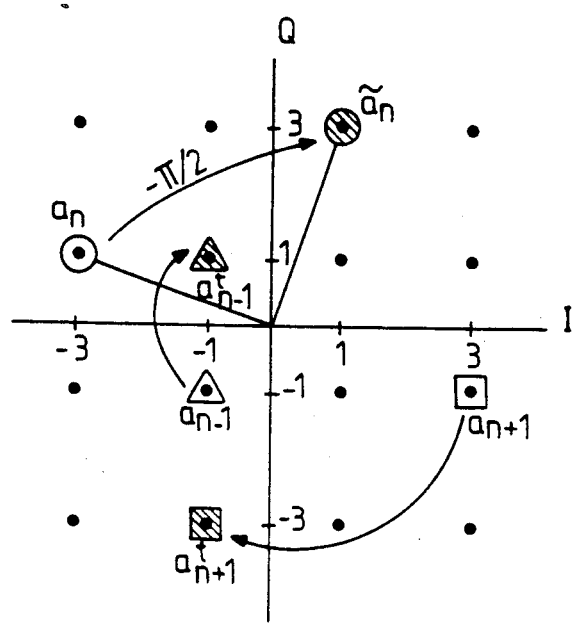
FIG. 6 shows a representation of the symbol rotation mechanism in the constellation plane.

In order to simplify the predistortion circuit 11, preferably the number of symbols taken into account may be equal to 3 ($a_{n-1}$, $a_n$, $a_{n+1}$). But if there are modulation methods having a large number of states, it is desirable to reduce the number of bits taken into account even further so as to reduce the size of the predistortion circuit. For this reason it should be observed (FIG. 6) that as regards the symmetry of the constellation, one quarter plane is sufficient to represent the predistorted symbols. In order to obtain $\bar{a}_n$ which is the image of any symbol $a_n$ of the constellation in the first quarter plane, it will be sufficient to let it undergo a rotation by $k\pi/2$, where $k=0$, 1, 2 or 3. The memory addressed by $\bar{a}_n$ instead of $a_n$, delivers the predistorted symbol $b_n$ situated in the first quarter plane of the constellation; a rotation by $-k\pi/2$ is necessary to find back $b_n$ (predistorted symbol corresponding with $a_n$). Since $\bar{a}_n$ is positive (positive real part and positive imaginary part) the two sign bits can be dropped and the size of the memory can be reduced by 4. While proceeding thus, the future and past symbols $a_{n+1}$ and $a_{n-1}$ have to undergo the same rotation (through the same angle) as $a_n$ has in order to give $a_{n+1}'$ and $a_{n-1}'$ two other symbols called rotated symbols belonging to the whole constellation and which will be used to address the memory together with $a_n$. The diagram of FIG. 6 shows an example of the passing of the triple value ($a_{n-1}$, $a_n$, $a_{n+1}$) to ($\bar{a}_{n-1}'$, $a_n$, $a_{n+1}'$) in the case of a 16-QAM constellation.

A constellation-to-quarter constellation (C-to-C/4) transforming circuit is thus necessary to yield $a_n$ at the output as a function of $\bar{a}_n$. Another reverse transforming circuit is necessary. Finally, a rotation circuit is necessary to yield ($a_{n-1}'$, $a_{n+1}'$) as a function of ($a_{n-1}$, $a_{n+1}$). With this simplification for only very simple additional circuits are necessary, a predistortion with a memory where L=3 implies memories having a capacity of 1K words in 16-QAM, and 64K words in 64-QAM methods.

Figure 5:
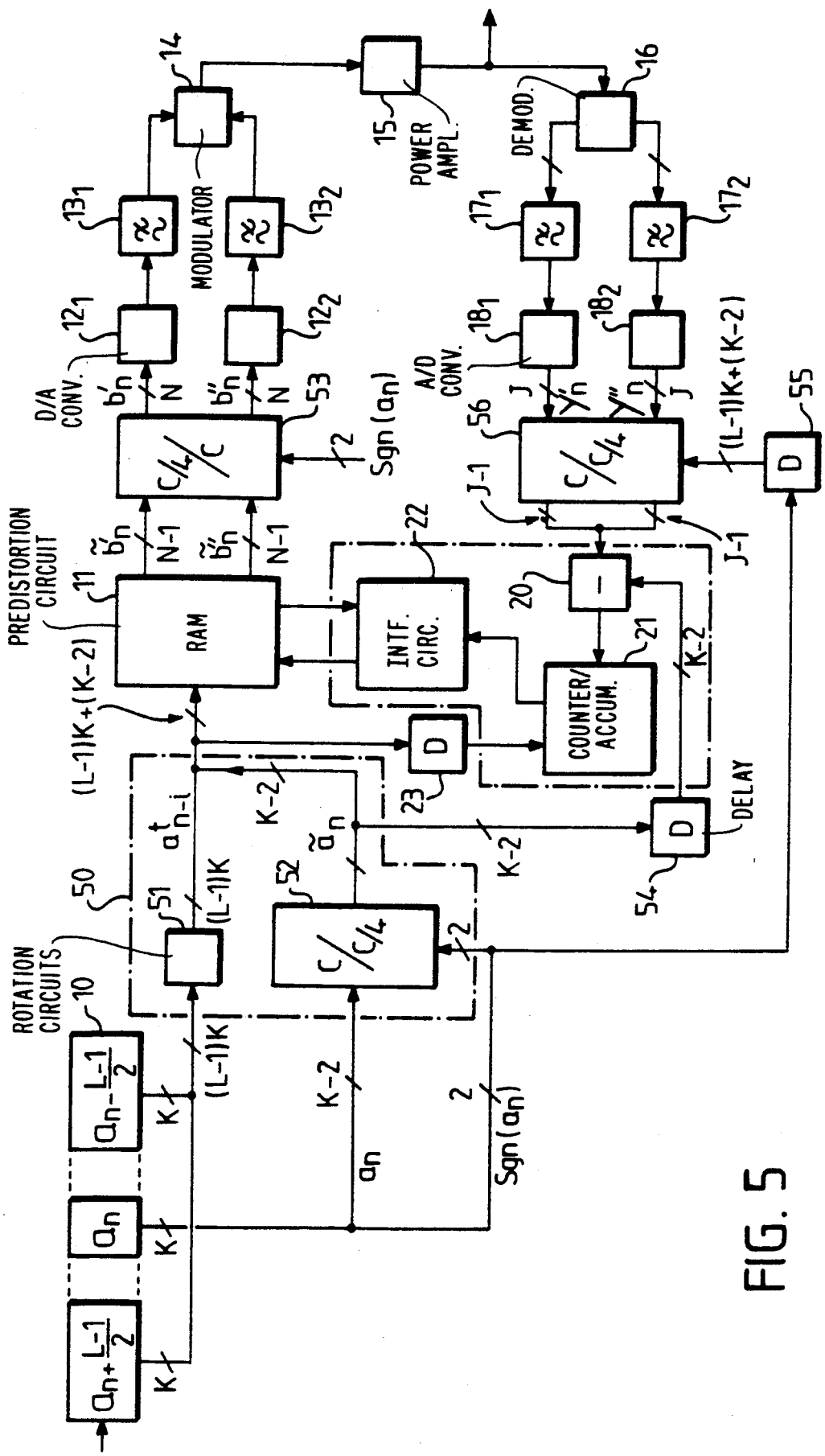
FIG. 5 is a diagram of the circuit of FIG. 4 including, in addition, means for operating in a quarter plane of the constellation.

An adaptive predistortion circuit with a memory which employs this modification is represented in FIG. 5. The same elements as those of FIG. 4 are represented by the same reference symbols. In addition, between the set 10 of input registers and the predistortion circuit 11 is inserted a transforming circuit 50 constituted by a set 51 of rotation circuits which influences the $(L-1)K$ data symbols $a_{n-i}$ (with $i \neq 0$) preceding or subsequent to the data symbol $a_n$ and a C-to-C/4 transforming circuit 52 which receives the $K-2$ least significant bits of the data symbol $a_n$ and also its 2 sign bits. The set of rotation circuits 51 supplies $(L-1)K$ bits of the rotated data symbols $a_{n-i}'$ and the transforming circuit 52 supplies $(K-2)$ bits of the data symbol $a_n$. The predistortion circuit 11 is addressed by the $(L-1)K+(K-2)$ bits and supplies the in-phase predistorted data symbol $b'_n$ and quadrature predistorted data symbols $b''_n$ in a quarter plane of the constellation. In their turn they are transformed into the entire plane of the constellation by a reverse transforming circuit 53 which receives the two sign bits of ($a'_n$, $a''_n$) and restores the predistorted data symbols $\bar{b}'_n$ and $b''_n$. The rest of the operations in the transmitter remains unchanged.

The adaptation path includes, after the demodulator 16, the filters $17_1$ and $17_2$ and the analog-to-digital converters $18_1$ and $18_2$, a C-to-C/4 transforming circuit 56 operating on the in-phase and quadrature paths addressed by the 2 sign bits of ($a'_n$, $a''_n$). This transforming circuit is identical to the circuit 52. The supplied data are processed by the comparator circuit 20 and the set of counters/accumulators 21 as has been mentioned hereinbefore. Delay elements 54, 55 enable synchronization of the operations.

Figure 7A:
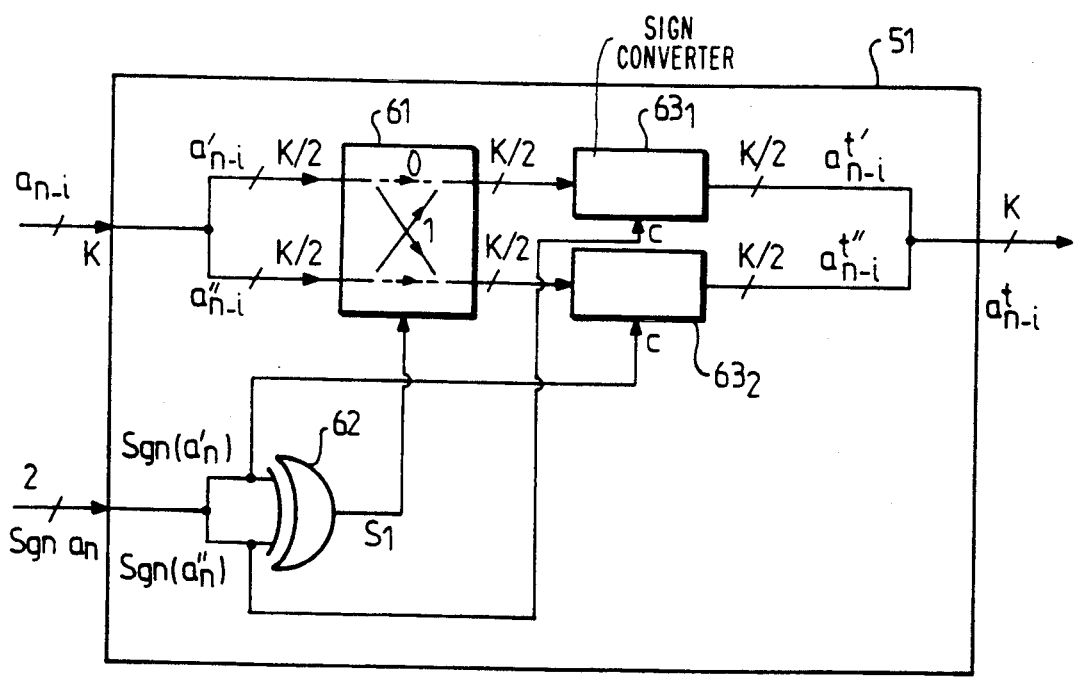
FIG. 7A is a diagram of a rotation circuit.

An exemplary embodiment of a rotation circuit of the set 51 is represented in FIG. 7A. The bits of a data symbol $a_{n-i}$ (with $i \neq 0$) enter a permutation circuit 61 permuting $a'_{n-i}$ and $a''_{n-i}$ under the control of a signal $S_1$ coming from an Exclusive-OR gate 62 which receives the 2 sign bits of the in-phase path $a'_n$ and quadrature path $a''_n$ which belong to the data symbol $a_n$ (with, for example, the positive sign encoded by 0 and the negative sign encoded by 1). The two output signals of the permutation circuit 61 enter a sign conversion block $63_1$ or $63_2$, controlled respectively by the sign of $a''_n$ (sgn $a''_n$) and the sign of $a'_n$ (sgn $a'_n$). Thus, one obtains rotated data $a'_{n-i}{}'$ and $a''_{n-i}{}'$. With a positive sign encoded by 0 and a negative sign encoded by 1, the sign conversion will take place if the control bit is 1, this means that the sign is negative. An inverse convention may be used. Each data symbol $a_{n-i}$ is thus converted by such a rotation block.

The rotation circuit thus comprises:

an Exclusive-OR gate receiving the two sign bits $a'_n$ and $a''_n$ and producing a control signal $S_1$, a permutation circuit receiving at one input $a'_{n-i}$ and at the other input $a''_{n-i}$ (with $-(L-1)/2 \leq i \leq (L-1)/2$), and permuting this data at its output for a given logic state of $S_1$ and not permuting it for the inverse logic state, each output of the permutation circuit being followed by a sign-conversion block controlled by the initial sign bits of the inverse path in order to supply the rotated data $a'_{n-i}{}'$ and $a''_{n-i}{}'$. The sign conversion is performed if the control bit is 1, that is to say, the sign is negative according to our conventions.

Figure 7B:
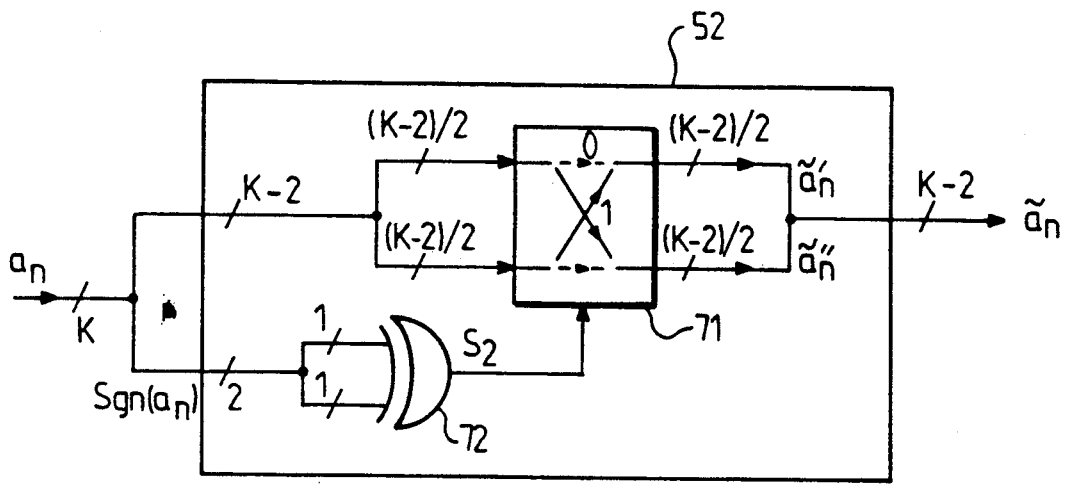
FIG. 7B is a diagram of a C-to-C/4 transforming circuit.

An exemplary embodiment of the C-to-C/4 transforming circuit 52 is shown in FIG. 7B. The two sign bits of data symbol $a_n$ enter an Exclusive-OR gate 72 which controls (signal $S_2$) a permutation circuit 71 which permutes the in-phase and quadrature data (without their signs) when $S_2=1$ and which does not permute them if $S_2=0$. At the output one will obtain the transformed data symbol $\bar{a}_n = (\bar{a}'_n, \bar{a}''_n)$.

The C-to-C/4 transforming circuit comprises an Exclusive-OR gate which receives the two sign bits of $a'_n$ and $a''_n$ and supplies a control signal $S_2$ influencing a first permutation circuit which permutes the other bits of the data $a'_n$ and $a''_n$ for a given logic state $S_2$ and which does not permute them for the inverse logic state in order to form the image data symbol $\bar{a}_n = (\bar{a}'_n, \bar{a}''_n)$.

Figure 7C:
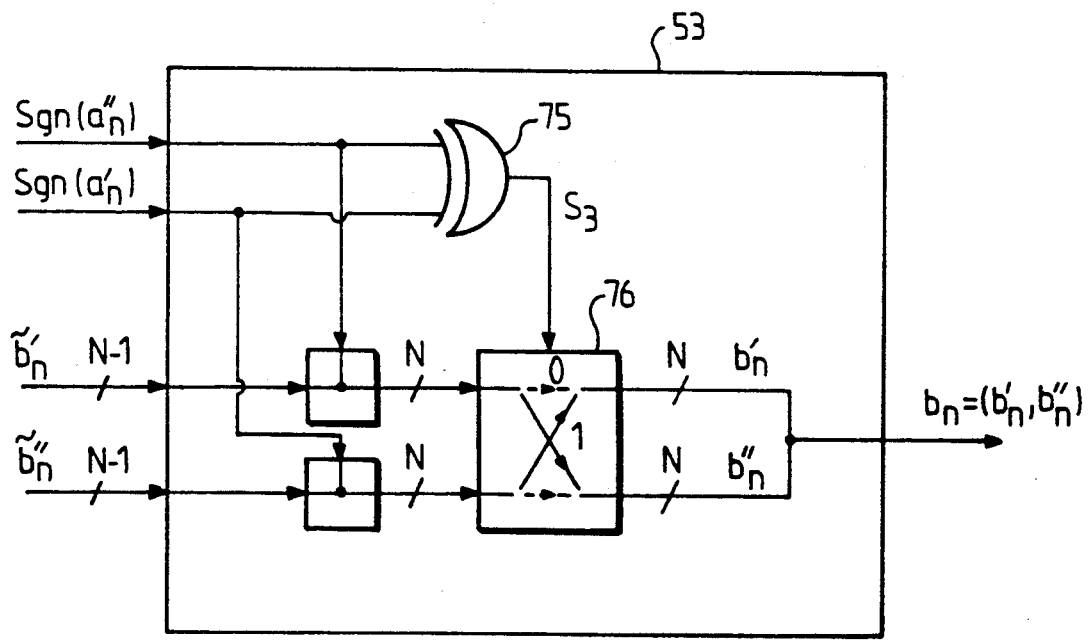
FIG. 7C is a diagram of a C/4-to-C transforming circuit.

An exemplary embodiment of the C/4-to-C reverse transforming circuit 53 is represented in FIG. 7C. The two sign bits of $a'_n$ and $a''_n$ enter an Exclusive-OR gate 75 (signal $S_3$) which controls a permutation circuit 76 permuting the data if $S_3=1$ and not permuting it if $S_3=0$. At the input the permutation circuit receives at one input the $(N-1)$ bits of $\bar{b}'_n$ and the sign bit of $a''_n$ and at the other the $(N-1)$ bits of $\bar{b}''_n$ and the sign bit of $a'_n$. At the output the data $b'_n$ and $b''_n$ (in-phase and quadrature) are obtained which relate to the predistorted data symbol $\bar{b}_n$ concerning the whole constellation.

Thus, the C/4-to-C transforming circuit comprises an Exclusive-OR gate which receives the two sign bits (a'$_n$, a"$_n$) and supplies a control signal S$_3$ that influences the permutation circuit that receives:

at one input, the image data $\bar{b}'_n$ completed by the sign bit of a"$_n$, at the other input, the image data $\bar{b}''_n$ completed by the sign bit of a'$_n$, the permutation circuit permuting at the output the input data for a given logic state S$_3$ and not permuting it for the inverse logic state in order to form the predistorted data symbols b$_n$=(b'$_n$, b"$_n$).

A further simplification may be brought about at the cost of a loss of performance with respect to the preceding optimum solution. In this embodiment, one only considers K' bits (K'<K) of the K bits representing the future and past symbols (a$_{n+1}$$^t$, a$_{n-1}$$^t$) addressing the memory 11. A partition of the constellation is thus realized.

Figure 8:
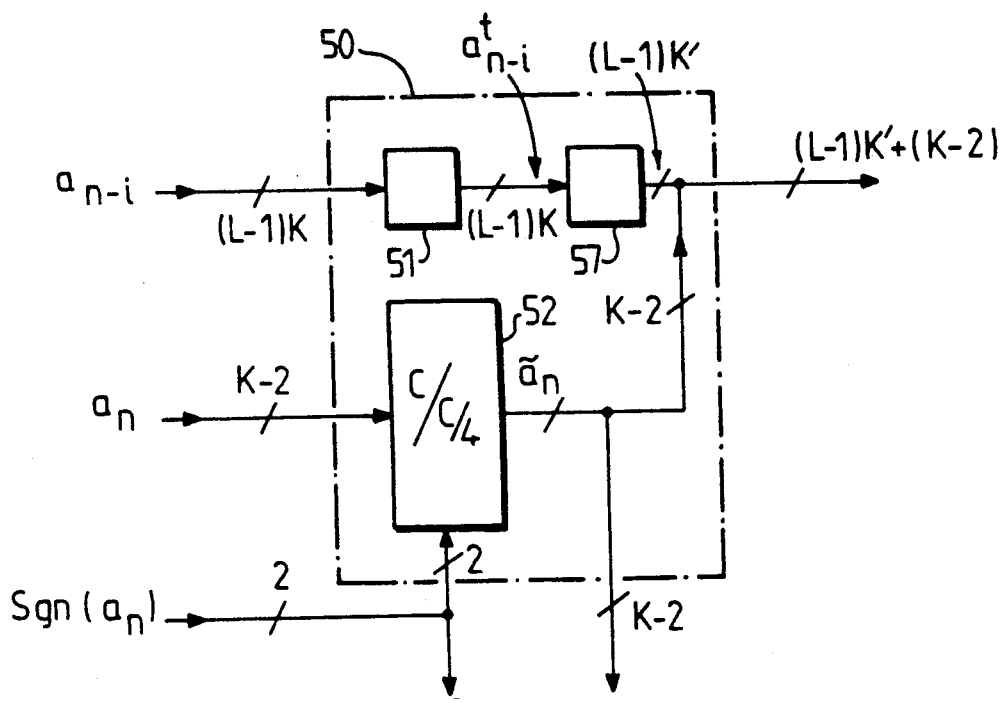
FIG. 8 is a diagram of a C-to-C/4 transforming circuit comprising a K-to-K' encoder that selects the number of bits.

The diagram of FIG. 8 represents a C-to-C/4 transforming circuit 50 which comprises, at the output of the rotation circuit 51, a K-to-K' encoder 57 encoding with K' bits (K'<K) the K bits of each data symbol.

The output of the K-to-K' encoder 57 provides the truncated data symbol a$_{n-i}$$^t$ which, grouped with the data symbol a$_n$ of circuit 52, constitute the addressing of the predistortion circuit 11.

A simple encoding consists of a rectangular partitioning. Thus, for example, one may take into account the two most significant bits and the two sign bits so that K'=4. In the 16-QAM method this partitioning corresponds with the non-simplified case. In 64-QAM and 256-QAM methods, 4K word and 16K word memories respectively are obtained if the predistortion memory in question has a size of L=3. When this predistortion technique with memory size L=3 uses memories of 4K in 64-QAM and 16K in 256-QAM methods, gain will be realised close to 2 dB with respect to conventional data predistortion without memory.

A further simplification, still with a rectangular partitioning, consists of considering only the sign bits so that K'=2. In this case for a predistortion with a memory size L=3, memories of 64 words in 16-QAM, 256 words in 64-QAM and 1K words in 256-QAM methods will be obtained. The gain in this case is found to be rather small in 64-QAM and 256-QAM methods but interesting in the 16-QAM method.

Figure 9:
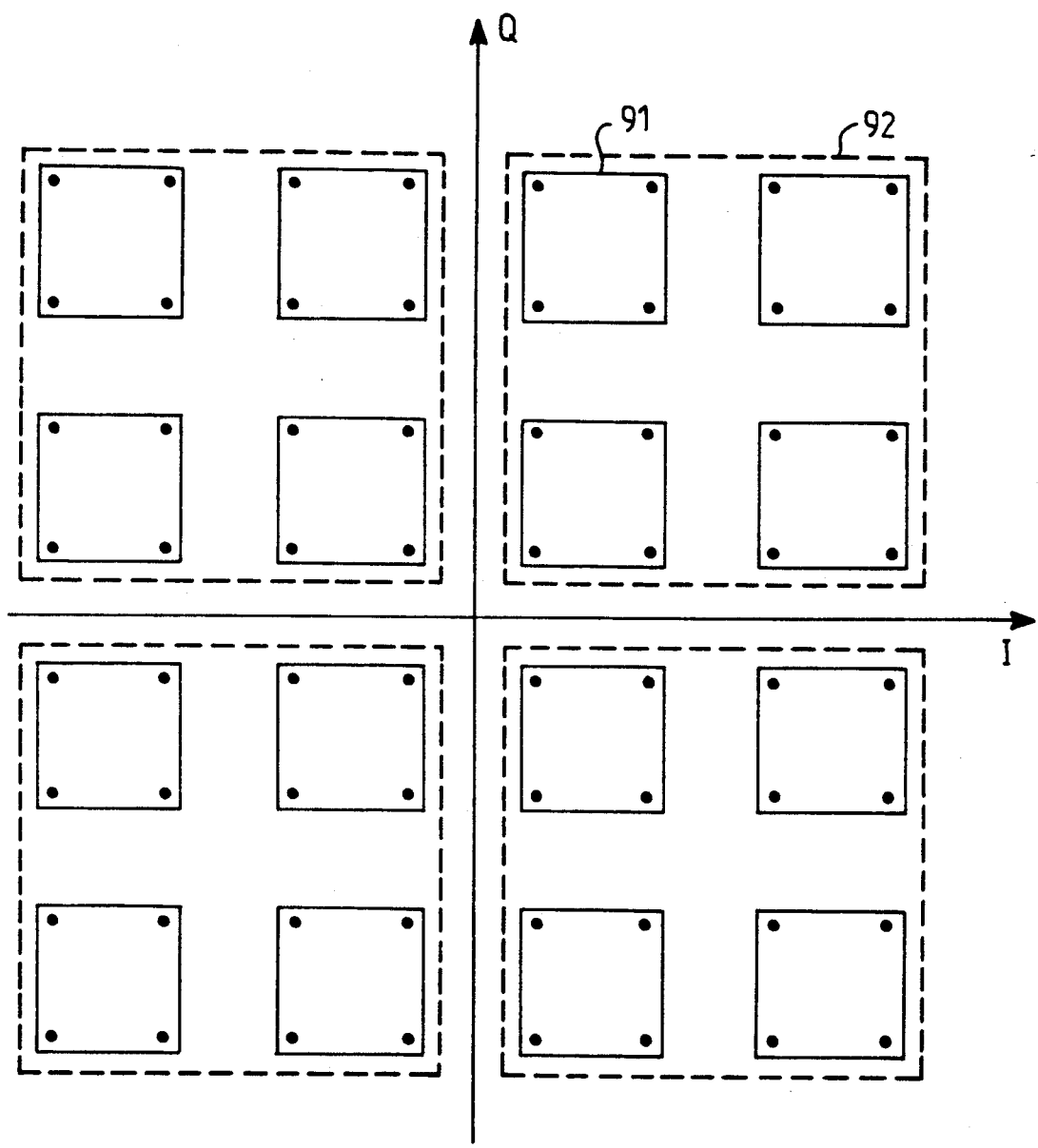
FIG. 9 shows a representation of two examples of the partition of the 64-QAM constellation.

FIG. 9 represents these two examples of the partitioning K'=4 and K'=2 in the case of a 64-QAM modulation method.

The partitioning with K'=4 is represented by the set of squares, such as the group 91, which regroups 4 adjacent states of the constellation.

The partitioning with K'=2 is represented by the four squares, such as group 92, which regroups 16 states of a same quarter plane.

Other partitionings may be envisaged which are selected by the K-to-K' encoder.

We claim:

1. An adaptive predistortion circuit with memory for a digital transmission system which transmits input data to be represented by points of a signal constellation C and which occur at the rate of a symbol clock having a period T, and wherein a modulator and a power amplifier coupled to the predistortion circuit distort the signal by creating smeared spots (clouds) in the constellation, the circuit comprising:

a predistortion circuit for predistorting in the reverse sense in-phase and quadrature input data symbols a$_n$=(a'$_n$, a"$_n$) prior to their entering the power amplifier in order to transmit expected levels, the predistortion circuit simultaneously taking into account a number L of received input symbols a$_{n+(L-1)/2}$... a$_n$... a$_{n-(L-1)/2}$ which are temporarily stored in a memory comprising input shift registers, a demodulator for deriving in-phase data symbols (y'$_n$) and quadrature data symbols (y"$_n$), an adaptation circuit for continuously adapting the predistortion circuit to a stream of input data symbols and comprising a comparator circuit that compares the in-phase (a'$_n$) and quadrature (a"$_n$) input data symbols with the demodulated in-phase (y'$_n$) and the demodulated quadrature (y"$_n$) data symbols, and an interface circuit for continuously updating the predistortion circuit in response to an output signal of the comparator circuit, characterized in that the adaptation circuit further comprises, coupled between the comparator circuit and the interface circuit, a set of counters/accumulators which determine the center of gravity of each smeared spot (cloud) of the received constellation by calculating a set of means errors that is used to adapt the predistortion circuit, and a first filter F$_e$ connected before the modulator and operating on the in-phase and quadrature paths and a second filter F$_r$ connected after the demodulator and also operating on the in-phase and quadrature paths and in a manner such that the product of the filtering performed by the first and second filters F$_e$ and F$_r$ corresponds to a Nyquist filtering.

2. An adaptive predistortion circuit as claimed in claim 1, wherein the number L of data symbols taken into account is equal to 3: a$_{n-1}$, a$_n$, a$_{n+1}$.

3. An adaptive predistortion circuit with memory as claimed in claim 1, further comprising a circuit for transforming the signal constellation C into a quarter of the constellation (C/4) and coupled between the input registers and the predistortion circuit, which transforming circuit includes a C-to-C/4 transforming circuit that transforms all of the received symbols a$_n$ of the constellation C into image data $\bar{a}_n$ of a given quarter constellation plane C/4 and means for performing a rotation by k$\pi$/2 of the symbols preceding and subsequent to the symbol a$_n$, where k=0, 1, 2 or 3 according to the original quarter plane of the constellation C, an output of the predistortion circuit being coupled to a C/4-to-C reverse transforming circuit for restoring the order of constellation C, and a further C-to-C/4 transforming circuit being connected between the adaptation circuit and the demodulator.

4. An adaptive predistortion circuit as claimed in claim 3, wherein the C/4-to-C reverse transforming circuit comprises an Exclusive-OR gate receiving the two sign bits (a'$_n$, a"$_n$) and supplying a control signal S$_3$ that controls a permutation circuit, and wherein the permutation circuit receives at one input in-phase image data $\bar{b}'_n$ of the predistortion circuit completed by the sign bit of a"$_n$ and at its other input quadrature image data $\bar{b}''_n$ of the predistortion circuit completed by the sign bit of a'$_n$, the permutation circuit permuting at its output the received image data for a given logic state of control signal $S_3$ and not permuting said image data for a logic state of the control signal $S_3$ inverse to the given logic state in order to form predistorted data symbols $b_n = (b'_n, b''_n)$.

5. An adaptive predistortion circuit as claimed in claim 3, wherein the transforming circuit supplies the image data $a_n$ and rotated data $a_{n-i}$ (with $i \neq 0$) and the rotation performing neons comprises: a set of rotation circuits which operates on data symbols $a_{n-i}$ preceding and subsequent to the data symbol $a_n$.

6. An adaptive predistortion circuit as claimed in claim 5, wherein the C-to-C/4 transforming circuit comprises an Exclusive-OR gate receiving the two sign bits of $a'_n$ and $a''_n$ and producing a control signal $S_2$ that controls a first permutation circuit which permutes the other bits of the data $a'_n$ and $a''_n$ for a given logic state of control signal $S_2$ and which does not permute said other bits of data for a logic state inverse to the given logic state so as to form image data symbols $\tilde{a}_n = (\tilde{a}'_n, \tilde{a}''_n)$.

7. An adaptive predistortion circuit as claimed in claim 5, wherein the transforming circuit comprises, at an output of a rotation circuit, a K-to-K' encoder encoding into K' bits (K' < K) the K bits of each data symbol.

8. An adaptive predistortion circuit as claimed in claim 7, wherein the K' bits selected are the most significant bits of each data symbol.

9. An adaptive predistortion circuit as claimed in claim 8, wherein K' = 4 so that the selected bits are the 2 sign bits and the 2 most significant bits of each data symbol.

10. An adaptive predistortion circuit as claimed in claim 8, wherein K' = 2 so that the selected bits are the 2 sign bits of each data symbol.

11. An adaptive predistortion circuit as claimed in claim 5, wherein the C/4-to-C reverse transforming circuit comprises an Exclusibe-OR gate receiving the two sign bits ($a'_n, a''_n$) and supplying a control signal $S_3$ that controls a permutation circuit, and wherein p1 the permutation circuit receives at one input in-phase image data $\bar{b}'_n$ of the predistortion circuit completed by the sign bit of $a''_n$ and at its other input receives quadrature image data $\bar{b}''_n$ of the predistortion circuit completed by the sign bit of $a'_n$, the permutation circuit permuting at its output the received image data for a given logic state of control signal $S_3$ and not permuting said image data for a logic state of the control signal $S_3$ inverse to the given logic state in order to form predistorted data symbols $b_n = (b'_n, b''_n)$.

12. An adaptive predistortion circuit as claimed in claim 5, wherein a rotation circuit of said set of rotation circuits comprises: an Exclusive-OR gate receiving the two sign bits of $a'_n$ and $a''_n$ and supplying a control signal $S_1$, a permutation circuit controlled by control signal and receiving at one input data $a'_{n-i}$ and at the other input data $a''_{n-i}$ with $-(L-1)/2 \leq i \leq (L-1)/2$, and permuting said data at its output for a given logic state of control signal $S_1$ and not permuting the data for the inverse logic state, each output of the permutation circuit being followed by a sign conversion circuit controlled by the initial sign bit of the inverse path in order to produce rotated data $a'_{n-i}$ and $a''_{n-i}$.

13. An adaptive predistortion circuit as claimed in claim 12, wherein the C-to-C/4 transforming circuit comprises an Exclusive-OR gate receiving the two sign bits of $a'_n$ and $a''_n$ and producing a control signal $S_2$ that controls a first permutation circuit which permutes the other bits of the data $a'_n$ and $a''_n$ for a given logic state of control signal $S_2$ and which does not permute said other bits of data for a logic state inverse to the given logic state so as to form image data symbols $\tilde{a}_n = (\tilde{a}'_n, \tilde{a}''_n)$.

14. An adaptive predistortion circuit as claimed in claim 13, wherein the c/4-to-C reverse transforming circuit comprises an Exclusive-OR gate receiving the two sign bits ($a'_n, a''_n$) and supplying a control signal $S_3$ that controls a permutation circuit, and wherein the permutation circuit receives at one input in-phase image data $\bar{b}'_n$ of the predistortion circuit completed by the sign bits of $a''_n$ and at its other input receives quadrature image data $b''_n$ of the predistortion circuit completed by the sign bit of $a'_n$, the permutation circuit permuting at its output the received image data for a given logic state of control signal $S_3$ and not permuting said image data for a logic state of the control signal $S_3$ inverse to the given logic state in order to form predistorted data symbols $\bar{b}_n = (b'_n, b''_n)$.

15. A digital transmission system which transmits input data to be represented by points of a signal constellation C at the rate of a symbol clock having a period T, said system comprising:

a power amplifier that distorts the signal to create smeared spots (clouds) in the signal constellation, a memory apparatus for storing a number L of data input symbols $a_{n+(L-1)/2} \cdots a_n \cdots a_{n-(L-1)/2}$, a predistortion circuit coupled between said memory apparatus and said power amplifier and controlled by said stored data input symbols for predistorting, in a sense opposite to the distortion in the power amplifier, in-phase ($a'_n$) and quadrature phase ($a''_n$) input data symbols, a modulator, a first in-phase signal path and a second quadrature phase signal path coupled in parallel circuit between the predistortion circuit and the modulator, means coupling an output of the modulator to an input of the power amplifier whereby said predistortion circuit, said parallel circuit, said modulator and said power amplifier are coupled together in cascade, a demodulator coupled to an output of the power amplifier to produce at an output of the demodulator a stream of in-phase and quadrature phase demodulated data symbols ($y'_n, y''_n$) in response to a stream of data symbols at the power amplifier output, an adaptation circuit having input means coupled to the memory apparatus and to the demodulator output and responsive to the input data symbols and the demodulated data symbols ($y'_n, Y''_n$) for continuously adapting the predistortion circuit to the input data symbols as a function of said demodulated data symbols, said adaptation circuit comprising a comparator circuit that compares in-phase and quadrature phase input data symbols ($a'_n, a''_n$) with said in-phase and quadrature phase demodulated data symbols ($y'_n, y''_n$), an interface circuit for continuously updating the predistortion circuit and, between the comparator circuit and the interface circuit, means for calculating a set of mean errors so as to determine a center of gravity of each smeared spot (cloud) of the signal constellation, first filter means (Fe) connected in said first and second signal paths, and second filter means (Fr) connected between the demodulator output and the comparator circuit and responsive to the in-phase and quadrature phase demodulated data symbols.

16. A digital transmission system as claimed in claim 15 wherein said predistortion circuit comprises a random access memory (RAM) addressed by the data input symbols stored in the memory apparatus, said system further comprising:

digital/analog converter means in said first and second signal paths, and analog/digital converter means coupled between the demodulator output and the comparator circuit and coupled in cascade with the second filter means.

17. A digital transmission system as claimed in claim 15 further comprising a signal transformation circuit coupled between said memory apparatus and the predistortion circuit, said signal transformation circuit comprising:

a C-to-C/4 tranforming circuit for transforming the signal constellation C into a quarter constellation C/4 by transformation of the input data symbols $a_n$ of the signal constellation C into image data $\tilde{a}_n$ of a quarter constellation plane C/4, and means for rotating by $\pi/2$ data symbols preceding and subsequent to data symbol $a_n$, where K=0,1,2 or 3 said digital transmission system further comprising;

a C/4-to-C reverse transforming circuit coupled between the predistortion circuit and the modulator and operative to restore the signal constellation C, and a further C-to-C/4 transforming circuit coupled between the demodulator output and the comparator circuit and in cascade with the second filter means.

18. A digital transmission system as claimed in Claim 17 wherein said rotating means comprises:

a gate circuit having first and second inputs for receiving sign bit $a'_n$ and $a''_n$, respectively, of data input symbol $a_n$ and having an output that supplies a control signal ($S_1$), a permutation circuit controlled by said control signal ($S_1$) and having first and second inputs that receive data input symbols $a_{n-1}$ and $a_{n+1}$, first and second sign conversion circuits coupled to first and second outputs, respectively, of the permutation circuit, and means coupling respective control inputs of the first and second sign conversion circuits to said second and first inputs, respectively, of the gate circuit.

19. A digital transmission system as claimed in Claim 17 wherein said C-to-C/4 transforming circuit comprises:

a gate circuit having first and second inputs for receiving sign bits $a'_n$ and $a''_n$, respectively, of data input symbol $a_n$ and having an output that supplies a control signal ($S_2$), a permutation circuit controlled by said control signal ($S_2$) and having input means that receive other bits $a'_n$ and $a''_n$ of the data input symbols and output means that supply image data symbols ($\tilde{a}'_n$, $\tilde{a}''_n$).

* * * * *

UNITED STATES PATENT AND TRADEMARK OFFICE
CERTIFICATE OF CORRECTION

PATENT NO. : 5,148,448
DATED : Sept. 15, 1992
INVENTOR(S) : Georges Karam et al

It is certified that error appears in the above-indentified patent and that said Letters Patent is hereby corrected as shown below:

IN THE ABSTRACT line 3, after "symbols" insert --,-- (comma);
line 6, after "(15)" insert -,- (comma);

line 17, after "memory" insert --,-- (comma);
line 18, after "the" (first occurrence) insert --data--; change "is" to --can be--; and "data" to --the--.

IN THE CLAIMS

Claim 3, column 10, line 48, after "4" insert --,-- (comma).

Claim 5, column 11, line 7, change "$a_{n-i}^t$" to -- $a_{n-i}^t$ --;
line 8, change "neons" to --means--.

Claim 17, column 13, line 29, after "3" insert --,-- (comma).

UNITED STATES PATENT AND TRADEMARK OFFICE
CERTIFICATE OF CORRECTION

PATENT NO. : 5,148,448
DATED : Sept. 15, 1992
INVENTOR(S) : Georges Karam et al

It is certified that error appears in the above-indentified patent and that said Letters Patent is hereby corrected as shown below:

Claim 18, column 14, line 9, change "bit" to --bits--.

Signed and Sealed this

Third Day of May, 1994

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,148,448                        Page 1 of 2
DATED       : Sept. 15, 1992
INVENTOR(S) : Georges Karam et al It is certified that error appears in the above-indentified patent and that said Letters Patent is hereby corrected as shown below:

IN THE ABSTRACT

Title page, item [57],
line 3, after "symbols" insert --,-- (comma);
line 6, after "(15)" insert -,- (comma);

line 17, after "memory" insert --,-- (comma);
line 18, after "the" (first occurrence) insert
--data--; change "is" to --can be--; and "data"
to --the--.

Claim 3, column 10, line 48, after "4" insert --,--
(comma).

Claim 5, column 11, line 7, change "$a_{n-i}$'" to -- $a^{t}_{n-i}$ --;
line 8, change "neons" to --means--.

Claim 17, column 13, line 29, after "3" insert --,-- (comma).

UNITED STATES PATENT AND TRADEMARK OFFICE
CERTIFICATE OF CORRECTION

PATENT NO. : 5,148,448
DATED : Sept. 15, 1992
INVENTOR(S) : Georges Karam et al

It is certified that error appears in the above-indentified patent and that said Letters Patent is hereby corrected as shown below:

Claim 18, column 14, line 9, change "bit" to --bits--.

Signed and Sealed this

Twenty-eighth Day of June, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,148,448
DATED : September 15, 1992
INVENTOR(S) : Georges Karam et al It is certified that error appears in the above-indentified patent and that said Letters Patent is hereby corrected as shown below:

IN THE ABSTRACT line 14, after "set of" insert --mean--.

Column 3, line 56, change "adapt. The" to --adapt the--; change "circuit, the" to --circuit. The--.

Claim 1, column 10, line 28, change "means" to --mean--.

Signed and Sealed this

Twenty-seventh Day of December, 1994

Attest:

BRUCE LEHMAN

Attesting Officer

Commissioner of Patents and Trademarks